United States Patent
Golke et al.

(10) Patent No.: US 6,180,984 B1
(45) Date of Patent: Jan. 30, 2001

(54) INTEGRATED CIRCUIT IMPEDANCE DEVICE AND METHOD OF MANUFACTURE THEREFOR

(75) Inventors: Keith W. Golke, Minneapolis; Paul S. Fechner, Plymouth, both of MN (US)

(73) Assignee: Honeywell Inc., Morristown, NJ (US)

( * ) Notice: Under 35 U.S.C. 154(b), the term of this patent shall be extended for 0 days.

(21) Appl. No.: 09/219,804

(22) Filed: Dec. 23, 1998

(51) Int. Cl.$^7$ .................................................. H01L 29/10
(52) U.S. Cl. ..................... 257/347; 257/348; 257/349; 257/350; 257/351; 257/352; 257/353; 257/354; 257/355
(58) Field of Search ..................... 257/347–355

(56) References Cited

U.S. PATENT DOCUMENTS

| | | | |
|---|---|---|---|
| 4,725,981 | 2/1988 | Rutledge | 365/154 |
| 4,797,804 | * 1/1989 | Rocket, Jr. | 307/291 |
| 4,912,675 | 3/1990 | Blake et al. | 365/154 |
| 5,301,146 | 4/1994 | Hama . | |
| 5,378,919 | 1/1995 | Ochiai . | |
| 5,631,863 | 5/1997 | Fechner et al. | 365/156 |
| 5,729,039 | * 3/1998 | Beyer et al. | 257/347 |
| 5,763,904 | * 6/1998 | Nakajima et al. | 257/347 |

FOREIGN PATENT DOCUMENTS

| | | |
|---|---|---|
| 0 199 231 | 10/1986 | (EP) . |
| 0 281 741 | 9/1988 | (EP) . |
| 0 650 190 | 4/1995 | (EP) . |
| 0 727 784 | 8/1996 | (EP) . |
| 55-001127 | 1/1980 | (JP) . |

OTHER PUBLICATIONS

Andrews, J.L. et al., "Single Event Error Immune CMOS RAM," *IEEE Transactions on Nuclear Science*, vol. NS–29, No. 6, Dec. 1982, pp. 2040–2043.

Calin, T. et al., "Upset Hardened Memory Design for Submicron CMOS Technology," *IEEE Transactions on Nuclear Science*, vol. 43, No. 6, Dec. 1996, pp. 2874–2878.

Chen, Chao–Cheng et al., "A Circuit Design for the Improvement of Radiation Hardness in CMOS Digital Circuits," *IEEE Transactions on Nuclear Science*, vol. 39, No. 2, Apr. 1992, pp. 272–277.

(List continued on next page.)

Primary Examiner—Fetsum Abraham
(74) Attorney, Agent, or Firm—Kris T. Fredrick

(57) ABSTRACT

A multi-purpose device that can serve as either a resistor, MOSFET or JFET is disclosed. The resistor is formed by selecting a first metal interconnect configuration, the MOSFET is formed by selecting a second metal interconnect configuration, and the JFET is formed by selecting a third metal interconnect configuration. Because of the dual transistor/resistor nature of this device, the density of a typical gate array that uses resistors may be increased. In addition, and because no special processing is typically required, the device may be desirable for use in other types of structures such as standard cells and custom logic.

25 Claims, 16 Drawing Sheets

OTHER PUBLICATIONS

Diehl, S.E. et al., "Considerations for Single Event Immune VLSI Logic," *IEEE Transactions on Nuclear Science*, vol. NS–30, No. 6, Dec. 1983, pp. 4501–4507.

Giddings, Alfred E. et al., "Single Event Upset Immune Integrated Circuits for Project Galileo," *IEEE Transactions on Nuclear Science*, vol. NS–32, No. 6, Dec. 1985, pp. 4159–4163.

Golke, K.W. et al., "Test Results of a SEU Hardened 8T Memory Cell for a 1M SRAM," *Journal of Radiation Effects*, vol. 13, No. 1, Jan. 1996, pp. 99–105.

Hauser, John R., "SEU–Hardened Silicon Bipolar and GaAs MESFET SRAM Cells Using Local Redundancy Techniques," *IEEE Transactions on Nuclear Science*, vol. 39, No. 1, Feb. 1992, pp. 2–6.

Johnson, Richard L. Jr. et al., "An Improved Single Event Resistive–Hardening Technique for CMOS Static RAMs," *IEEE Transactions on Nuclear Science*, vol. NS–33, No. 6, Dec. 1986, pp. 1730–1733.

Liu, M. Norley et al., "Low Power SEU Immune CMOS Memory Circuits," *IEEE Transactions on Nuclear Science*, vol. 39, No. 6, Dec. 1992, pp. 1679–1684.

Massengill, Lloyd W., "SEU–Hardened Resistive–Load Static RAMs," *IEEE Transactions on Nuclear Science*, vol. 38, No. 6, Dec. 1991, pp. 1478–1485.

Rockett, Jr., "Simulated SEU Hardened Scaled CMOS SRAM Cell Design Using Gated Resistors," *IEEE Transactions on Nuclear Science*, vol. 39, No. 5, Oct. 1992, pp. 1532–1541.

Velazco, R. et al., "Two CMOS Memory Cells Suitable for the Design of SEU–Tolerant VLSI Circuits," *IEEE Transactions on Nuclear Science*, vol. 41, No. 6, Dec. 1994, pp. 2229–2234.

Weaver, H.T. et al., "An SEU Tolerant Memory Cell Derived From Fundamental Studies of SEU Mechanisms in SRAM," *IEEE Transactions on Nuclear Science*, vol. NS–34, No., 6, Dec. 1987, pp. 1281–1286.

Whitaker, Sterling et al., "SEU Hardened Memory Cells for a CCSDS Reed Solomon Encoder," *IEEE Transactions on Nuclear Science*, vol. 38, No. 6, Dec. 1991, pp. 1471–1477.

* cited by examiner

INTEGRATED CIRCUIT IMPEDANCE DEVICE AND METHOD OF MANUFACTURE THEREFOR

This application is related to co-pending U.S. patent application Ser. No. 09/219,807, filed Dec. 23, 1998 U.S. Pat. No. 6,058,041, and entitled "SEU Hardening Circuit", which is incorporated herein by reference.

BACKGROUND OF THE INVENTION

The present invention relates to integrated circuits, and more particularly, to integrated circuit impedance devices. There are typically a limited number of device types that are used in making most integrated circuits. The most common devices are the N-channel and P-channel transistors. Most logical functions can be implemented using a combination of only these two devices. However, some applications may require additional device types.

In one application, for example, resistors may be incorporated into a data storage circuit to increase the Single Event Upset (SEU) hardness of the data storage circuit. The resistors are typically connected in a cross-coupled configuration, as shown in FIG. 1. The cross-coupled resistors increase the SEU hardness of the data storage circuit by increasing the feedback delay around the data storage circuit. The increased delay provides the data storage circuit more time to remove any charge that is deposited during a radiation event. A further discussion of the use of resistors to increase the SEU hardness of a data storage circuit can be found in co-pending U.S. patent application Ser. No. 09/219,807, filed Dec. 23, 1998, entitled "SEU Hardening Circuit", which is incorporated herein by reference.

For many integrated circuit processes, such as MOSFET type process, the resistors are formed using a single polysilicon layer. The polysilicon layer is often the same polysilicon layer that is used to form the gates of the N-channel and P-channel transistors. The polysilicon layer of the N-channel and P-channel transistors is usually covered with a silicide layer to further enhance the conductivity thereof To make the polysilicon layer more resistive, therefore, a silicide blanking step must typically be performed. The silicide blanking step blanks the silicide layer from those locations that correspond to the polysilicon resistors. Additional processing may also be requires, such as selective implant processing, to achieve the desired resistance values. Because of this additional processing, the cost of producing such integrated circuits may be increased.

In addition, when such polysilicon resistors are used in conjunction with a typical gate array, the achievable gate density of the gate array may be reduced. In a typical gate array, such as a Sea-Of-Gates (SOG) gate array, all of the underlayers are typically prefabricated. The polysilicon and silicide layers are usually part of the pre-fabricated underlayers. To personalize the gate array, one or more metal layers are used to interconnect the pre-fabricated devices.

To make the polysilicon resistors widely available, the resistors are typically distributed among the standard transistors. For most circuits, however, only a small fraction of the gates require a resistor. For example, in a radiation-hard integrated circuit, only selected data storage circuits (e.g. latches, flip-flops, etc.) may need cross-coupled resistors to achieve a desired SEU hardness. The remaining circuits, including much of the combinational logic, typically does not need polysilicon resistors. Therefore, and because the resistors are typically distributed across the gate array, most of the resistors go un-used. These un-used resistors consume valuable silicon real-estate which could otherwise be used for transistors to increase the gate density of the gate array.

Therefore, it would be desirable to provide a device that can serve a dual function as either an impedance (e.g. resistor) or a standard transistor, depending on the metal interconnect layers provided. It would also be desirable if the device did not require any additional processing steps relative to those required for a conventional transistor.

SUMMARY OF THE INVENTION

The present invention overcomes many of the disadvantages of the prior art by first providing a device that can serve as either a resistor or a transistor. Preferably, the same underlayers are used to form the resistor and transistor. The resistor may then be formed by selecting a first metal interconnect configuration, and the transistor may be formed by selecting a second metal interconnect configuration. Because of the dual transistor/resistor nature of this device, the density of a typical gate array can be maintained while still providing readily available resistors for special applications such as SEU hardening selected data storage circuits. In addition, and because no special processing is typically required, the device may be desirable in other types of structures such as standard cells and custom logic. The term resistor as used herein is not limited to a conventional linear resistor, but rather may include all impedance producing devices including JFET and other field effect devices that can modulate a resistance.

In one illustrative embodiment, an impedance device is formed using the underlayers of an SOI transistor. The MOSFET SOI transistor has a source, a drain, a body, and a gate. The body of the transistor extends lengthwise under the gate but above the buried oxide from a first end body region on one side of the source/drain to a second end body region on the other side of the source/drain. The first end body region is coupled to a first terminal of the resistor, and the second end body region is coupled to a second terminal of the resistor.

In this configuration, the body region under the gate provides a bulk type resistance. If desired, the resistance can be modulated by controlling the voltage applied to the source, drain, gate and/or back-side of the SOI transistor. This modulation is JFET like in nature. In one embodiment, the source and/or drain are coupled to the first terminal of the resistor, and the gate is coupled to a predetermined voltage such as VDD or VSS. In other embodiments the source and/or drain may be left floating, or connected to VDD (n-channel MOSFET) or VSS (p-channel MOSFET). The gate may be coupled to VDD or VSS, or may be coupled to the first or second terminal of the resistor. Preferably, the resistor may be formed using the underlayers of a n-channel SOI transistor or a p-channel SOI transistor.

Rather than using the body of only one transistor, it is contemplated that a resistor may be formed using a body between two adjacent transistors. For example, a first transistor may have a first field region that defines the source and/or drain region of the first transistor. Likewise, a second transistor may have a second field region that defines the source and/or drain region of the second transistor. The resistor may be formed between the first and second field regions by including a body region therebetween. The body may extend lengthwise from a first end body region on one side of the first/second field regions to a second end body region on the other side of the first/second field regions. The first end body region may be coupled to the first terminal of the resistor, and the second end body region may be coupled to the second terminal of the resistor.

In this configuration, a gate may not be provided over an intermediate body region. Nonetheless, the body region provides a bulk resistance. If desired, the resistance of the intermediate body region may be modulated by applying a selected voltage to the first field region and/or second field region. The first field region and/or the second field region may be coupled to the first terminal of the resistor, left floating, or may be tied to a predetermined voltage such as VDD (n-channel MOSFET) or VSS (p-channel MOSFET).

If the SOI technology is fully depleted, rather than only partially depleted, a depletion region typically extends from the gate oxide to the buried oxide when the gate, source, drain, and first and second terminals are at, for example, an equal voltage. This depletion region causes the resistor to be fully pinched off under certain bias conditions. This can be unacceptable in some applications, such as in some SEU hardening circuits where the resistor must allow some leakage current to flow.

Therefore, when using a fully depleted SOI technology, it is contemplated that a majority carrier accumulation region may be intentionally created under the gate oxide, preferably under all bias conditions. This can be accomplished by including both an n-channel transistor and a p-channel transistor in a parallel configuration. The n-channel transistor may have a source, a drain, a body, and a gate, wherein the body extends lengthwise under the gate from a first end body region on one side of the gate to a second end body region on the other side of the gate. Likewise, the p-channel SOI transistor may have a source, a drain, a body, and a gate, wherein the body extends lengthwise under the gate from a first end body region on one side of the gate to a second end body region on the other side of the gate.

The first end body region, the source and the drain of the n-channel transistor and the second end body region of the p-channel transistor may then be coupled to a first terminal of the resistor. Likewise, the first end body region, the source and the drain of the p-channel transistor and the second end body region of the n-channel transistor may be coupled to a second terminal of the resistor. Preferably, the gate of the p-channel transistor is coupled to VDD and the gate of the n-channel transistor is coupled to VSS. This configuration may provide a majority carrier accumulation region under all bias conditions.

In another illustrative embodiment, the resistor may not necessarily be formed from the underlayers of a transistor. Rather, the resistor may be formed from a field oxide body tie region or a gate oxide body tie region such that there are no source/drain regions and is covered by a poly gate. In one embodiment, the resistor includes a body having a first end body region, a second end body region and an intermediate body region. The intermediate body region extends into the field region and under the gate. The gate is then coupled to a resistance modulation terminal. The resistance of the intermediate body region may then be modulated by applying a voltage to the gate via the resistance modulation terminal.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Briefly, one embodiment of the present invention provides a device that can serve as either a resistor or transistor. The term resistor as used herein is not limited to a conventional linear resistor, but rather may include all impedance producing devices including JFET and other field effect devices that can modulate a resistance. Preferably, the same underlayers are used to form the resistor and the transistor. The resistor is formed by selecting a first metal interconnect configuration and the transistor is formed by selecting a second metal interconnect configuration. Because of the dual transistor/resistor nature of this device, the density of a typical gate array that uses resistors may be increased. In addition, and because no special processing is typically required, the device may be desirable for use in other types of structures such as standard cells and custom logic. Other embodiments, as further described below, are also contemplated.

Figure 1:
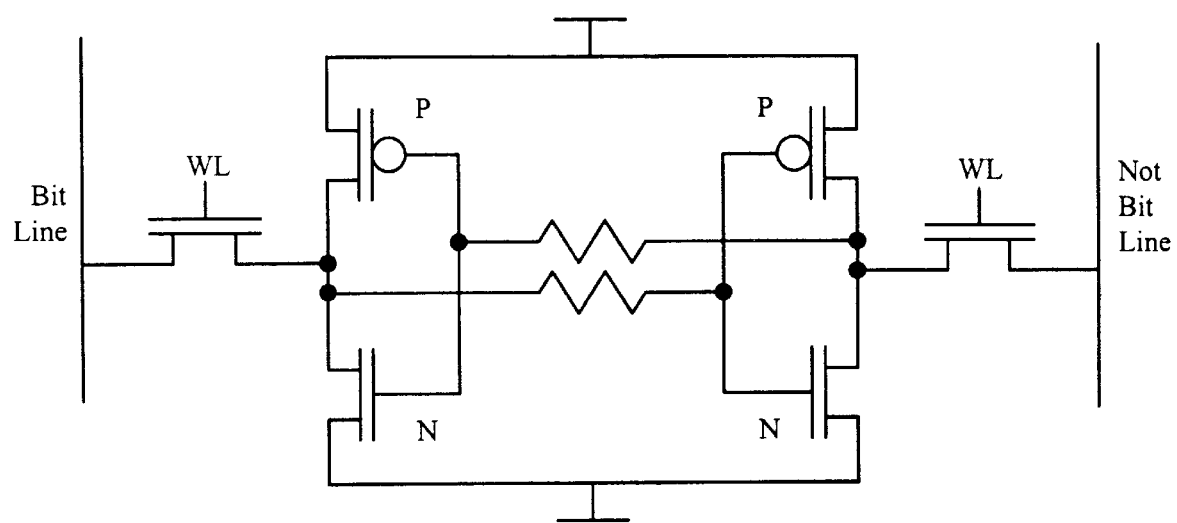
FIG. 1 is a schematic diagram of a data storage circuit using cross-coupled resistors as found in the prior art.
Figure 2:
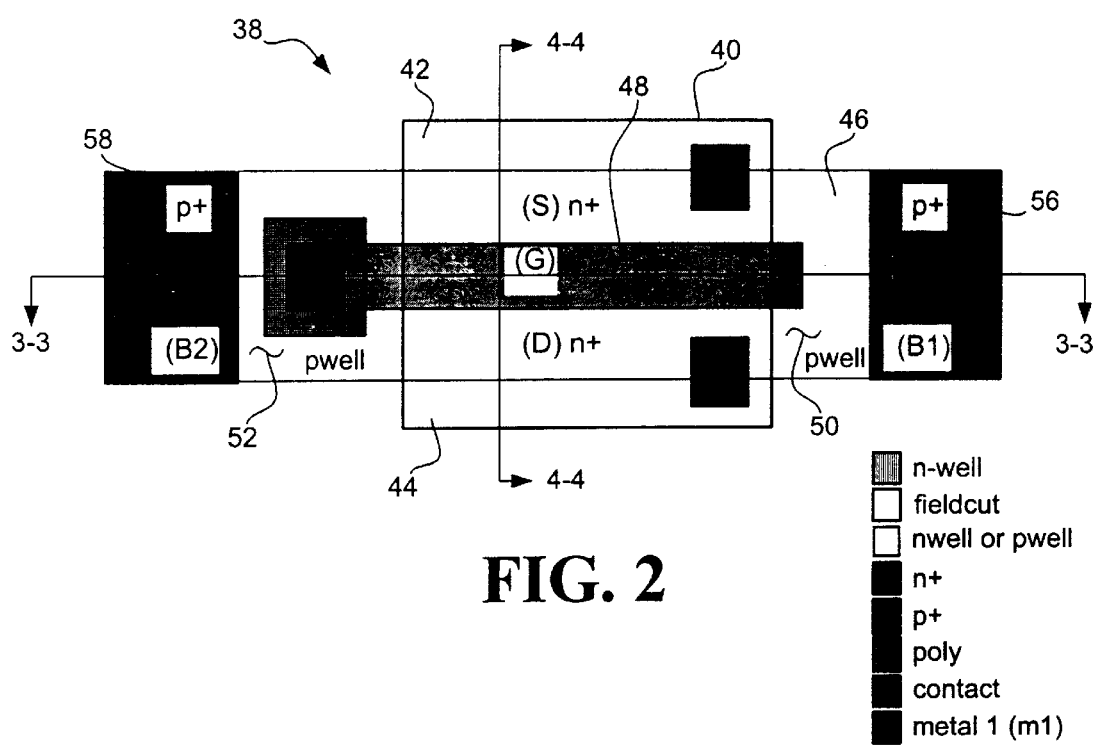
FIG. 2 is a top view of an illustrative resistor of the present invention formed from an n-channel SOI transistor.
Figure 3:
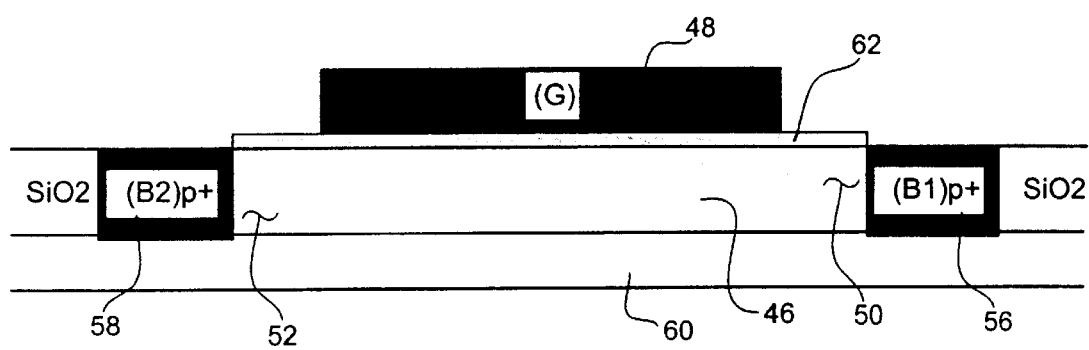
FIG. 3 is a partial cross-sectional side view of the n-channel resistor of FIG. 2 taken along line 3—3.
Figure 4:
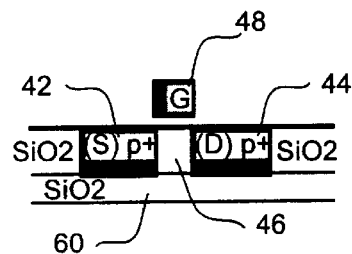
FIG. 4 is a partial cross-sectional side view of the n-channel resistor of FIG. 2 taken along line 4—4.

FIG. 2 is a top view of an illustrative resistor in accordance with the present invention formed from an n-channel SOI transistor. FIG. 3 is a partial cross-sectional side view of the n-channel resistor of FIG. 2 taken along line 3—3. FIG. 4 is a partial cross-sectional side view of the n-channel resistor of FIG. 2 taken along line 4—4. Although a resistor formed from an n-channel SOI transistor is shown, p-channel resistors are also contemplated.

The illustrative resistor is formed using the underlayers of SOI transistor 38. The SOI transistor 38 has a source 42, a drain 44, a body 46, and a gate 48. The body 46 extends lengthwise under the gate 48 from a first end body region 50 on one side of the source/drain field region 40 to a second end body region 52 on the other side of the source/drain field region 40. The first end body region 50 is coupled to a first terminal 56 of the resistor, and the second end body region 52 is coupled to a second terminal 58 of the resistor. In this configuration, the body region 46 under the gate 48 provides a bulk type resistance between the first terminal 56 and the second terminal 58. Further, it is contemplated that the resistance can be modulated by controlling the voltage applied to the source 42, the drain 44 and/or the gate 48 of the SOI transistor.

Figure 9:
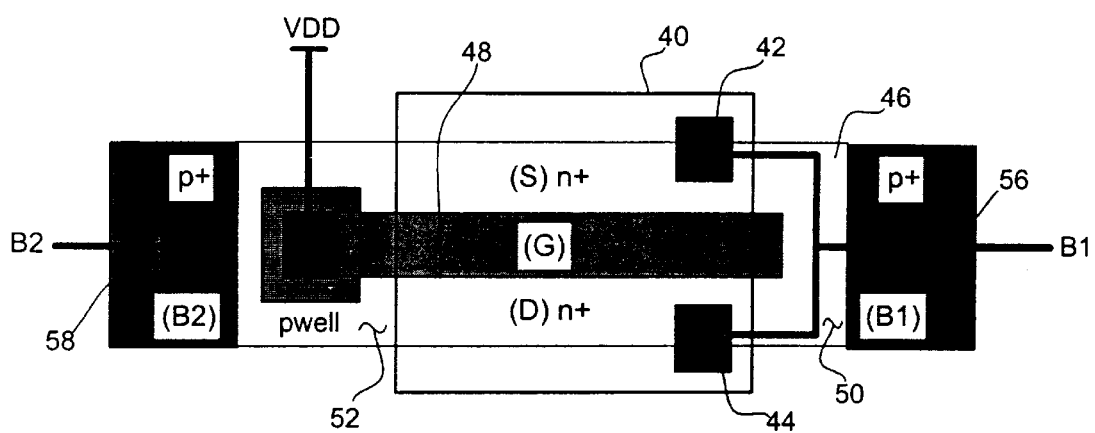
FIG. 9 is a top view of the n-channel transistor of FIG. 2 connected in accordance with the illustrative connection scheme of FIG. 7.

In one illustrative embodiment, the source 42 and/or drain 44 are coupled to the first terminal 56 of the resistor, and the gate 48 is coupled to a predetermined voltage such as VDD, as shown in FIG. 9. Alternatively, it is contemplated that the source 42 and/or drain 44 may be left floating or connected to VDD (n-channel device). It is also contemplated that the gate 48 may be coupled to the first terminal 56 or second terminal 58 of the resistor, rather than VDD or VSS.

Preferably, the same underlayers are used to form the resistor and the transistor. The resistor is formed by selecting a first metal interconnect configuration and the transistor is formed by selecting a second metal interconnect configuration. Because of the dual transistor/resistor nature of this device, the density of a gate array that uses such resistors may be increased. In addition, and because no special processing is typically required, the device may be desirable for use in other types of structures such as standard cells and custom logic.

For optimal performance, the resistor shown in FIG. 2 is created in a SOI technology where the source(S)/drain(D) implants extend down to a buried oxide (SiO2) layer 60. Cross-sections are shown in FIGS. 3 and 4. A transistor layout in this technology generally has a relatively high resistance in the body region 46 under the gate 48. The body region 46 can also be referred to as the sub-channel resistance (Rsch) region. By making connection to both sides of the body (nodes B1 and B2), the SOI transistor can be turned into a bulk silicon resistor. In order to have the resistance of the body 46 be the controlling resistance between B1 and B2, any parallel parasitic resistance under the source 42 and drain 44 regions must be much greater than the resistance of the body region, under all bias conditions. Therefore the source(S) 42 and drain(D) 44 implants preferably extend down to the buried oxide layer 60, or extend close enough to the buried oxide layer 60 so that the source(S) 42 and drain(D) 44 implants plus any depletion region spreading extend close enough to the buried oxide layer 60 so that the resulting resistance is much greater than the resistance of the body 46 under the gate 48.

Connecting the gate 48 of the n-channel transistor to VSS prevents the formation of a depletion and inversion region under the gate oxide 62 in the body region 46, but cause majority carrier accumulation under the gate oxide 62 when the first terminal 56 (B1) and the second terminal 58 (B2) are at a voltage opposite the gate 48. This effectively reduces the resistance of the body 46 under the gate 48.

Connecting the gate 48 of the n-channel transistor to VDD prevents the formation of a majority carrier accumulation region under the gate oxide 62 in the body region 46 under the gate 48, but causes a depletion and inversion region to form under the gate oxide 62 when the first terminal 56 (B1) and the second terminal 58 (B2) are at a voltage opposite the gate 48. This effectively increases the resistance of the body 46 under the gate 48.

Finally, connecting the gate 48 of the n-channel transistor to either the first terminal 56 or second terminal 58 of the resistor (B1 or B2) prevents the formation of accumulation, depletion or inversion regions when B1=B2, but creates a large coupling capacitance between B1 and B2. The large coupling capacitance may effectively short out the body region 46 during fast voltage transitions, such as those that may occur during an SEU event. The preferred connection for gate 48 is to VDD (p-channel gate to VSS).

Figure 5:
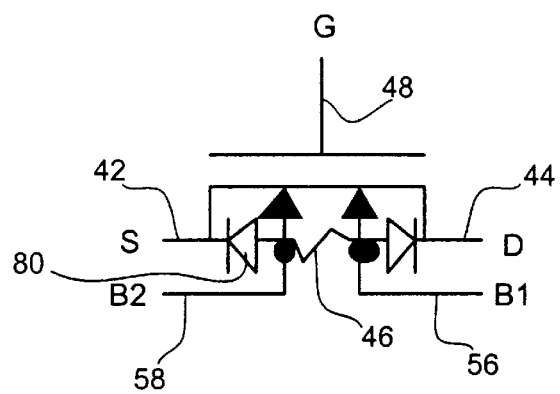
FIG. 5 is a schematic diagram of the n-channel resistor of FIGS. 2–4.

FIG. 5 is a schematic diagram of the n-channel resistor of FIGS. 2–4. The schematic shows a source 42, a drain 44, a gate 48, a body region 46, a first resistor terminal 56 and a second resistor terminal 58. Although a backside gate is typically present, it is not shown in the illustrative diagram. The body region 46 is shown as a resistor to show the bulk resistance between the first resistor terminal 56 and the second resistor terminal 58. Also shown is a parasitic body-to-source diode 80 and a parasitic body-to-drain diode 82.

Figure 6:
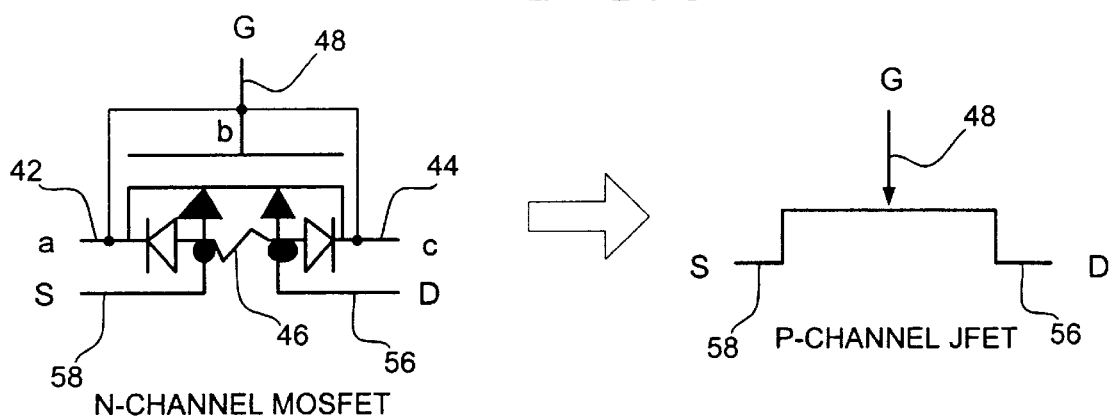
FIG. 6 is a schematic diagram of an n-channel MOSFET connected to form a p-channel JFET device.

FIG. 6 is a schematic diagram of an n-channel MOSFET connected to form a p-channel JFET device. In this embodiment, the first resistor terminal 56 of FIG. 5 is used as the drain terminal of the JFET device. Likewise, the second resistor terminal 58 of FIG. 5 is used as the source terminal of the JFET device. The MOSFET source, MOSFET drain and/or MOSFET gate terminals, or any combination thereof, may be used as the gate terminal of the JFET device. In the illustrative embodiment, the MOSFET source, MOSFET drain and/or MOSFET gate terminals are all connected together and are collectively used as the JFET gate terminal.

Figure 7:
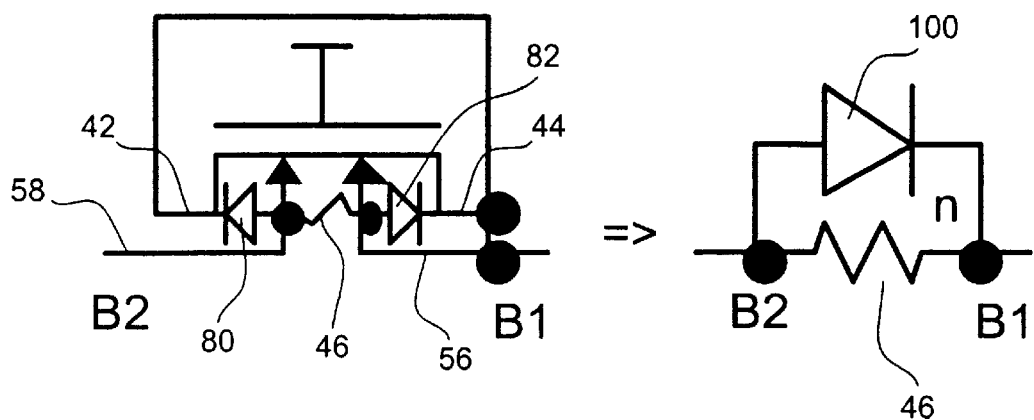
FIG. 7 is a schematic diagram showing an illustrative connection scheme for the n-channel resistor of FIGS. 2–4, along with an equivalent circuit.

FIG. 7 is a schematic diagram showing an illustrative connection scheme for the n-channel resistor of FIGS. 2–4, along with an equivalent circuit. In this embodiment, the source 42 and the drain 44 are connected to the first terminal 56 of the resistor, and the gate 48 is coupled to VDD (e.g. 5.0V). This produces an equivalent circuit having a resistor 46 in parallel with a diode 100. Diode 100 collectively represents the parasitic body-to-drain diode 82 and the parasitic body-to-source diode 80. Other configurations are also contemplated. For example, the MOSFET gate may be connected to VDD, VSS, B1 56 or B2 58. Likewise, the MOSFET source and MOSFET drain may be connected to VDD (n-channel device), B1 56, B2 58 or may be left floating.

In the illustrative embodiment of FIG. 7, both the source 42 and drain 44 are connected to the first resistor terminal B1 56. Therefore, the I-V characteristic between the first resistor terminal B1 56 and the second resistor terminal B2 58 verses applied voltage polarity is not symmetrical or linear. The diode 100 shown in FIG. 7 is one obvious reason for this, but even the resistive element 46 is not symmetrical. When the voltage on the first resistor terminal B1 56 is greater than the voltage on the second resistor terminal B2 58, the body-to-drain diode 82 and the body-to-source diode 80 become reverse biased and the depletion region increases as the voltage difference increases. This results in a resistance that increases with the applied voltage difference. In contrast, when the voltage on the first resistor terminal B1 56 is less than the voltage on the second resistor terminal B2 58, the body-to-drain diode 82 and the body-to-source diode 80 become forward biased and there is no depletion region increase. This results in a resistance that remains relatively constant regardless of the applied voltage difference.

Figure 8:
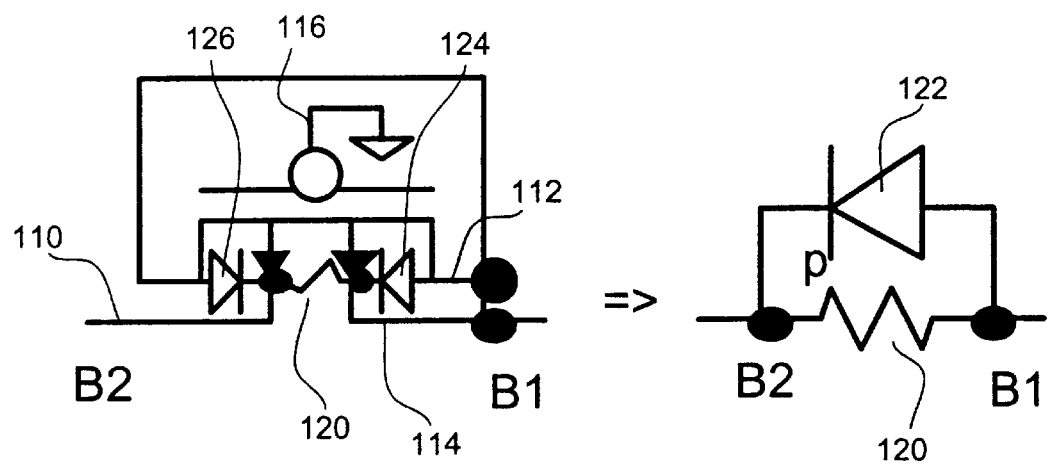
FIG. 8 is a schematic diagram showing an illustrative connection scheme for a p-channel resistor, along with an equivalent circuit.

FIG. 8 is a schematic diagram showing an illustrative connection scheme for a p-channel resistor, along with an equivalent circuit. In this embodiment, the source 110 and drain 112 are connected to the first terminal 114 of the resistor, and the gate 116 is coupled to VSS (e.g. 0.0V). This produces an equivalent circuit having a resistor 120 in parallel with a diode 122. Diode 122 collectively represents the parasitic drain-to-body diode 124 and the parasitic source-to-body diode 126. This embodiment behaves similar to the n-channel resistor shown in FIG. 7, but with opposite polarities.

Figure 10:
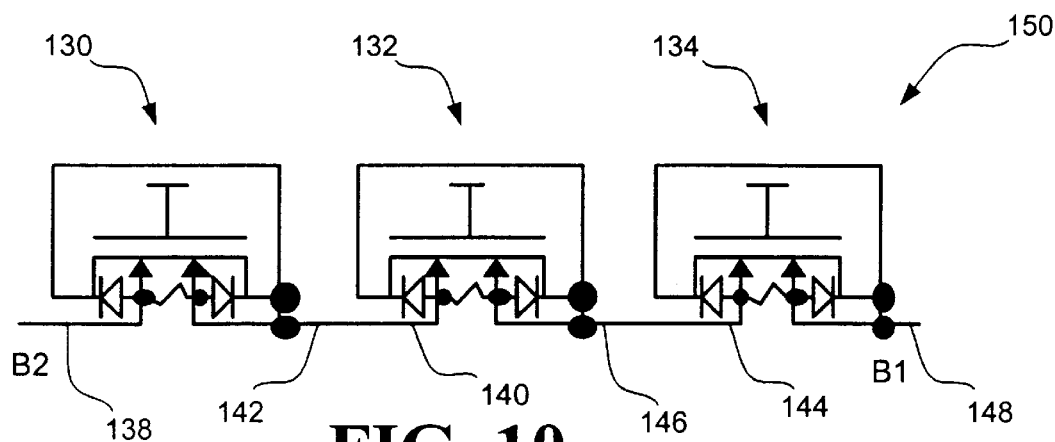
FIG. 10 is a schematic diagram showing an illustrative embodiment for connecting the n-channel resistors of FIGS. 2–4 in a series configuration.

In some applications, it may be desirable to increase the resistance provided by the n-channel resistor by connecting a number of the channel resistors in series. FIG. 10 shows an illustrative embodiment having three n-channel resistors connected in a series configuration. The three n-channel resistors are shown at 130, 132 and 134, respectively, and collectively form a series resistor 150. Each resistor has its source and drain connected to a first terminal of the corresponding resistor, and the gate 48 is coupled to VDD. The second terminal 138 of the first resistor 130 provides the input terminal to the series resistor 150. The second terminal 140 of the second resistor 132 is coupled to the first terminal 142 of the first resistor 130. The second terminal 144 of the third resistor 134 is coupled to the first terminal 146 of the second resistor 132. Finally, the first terminal 148 of the third resistor 134 provides an output terminal to the series resistor 150.

Figure 11:
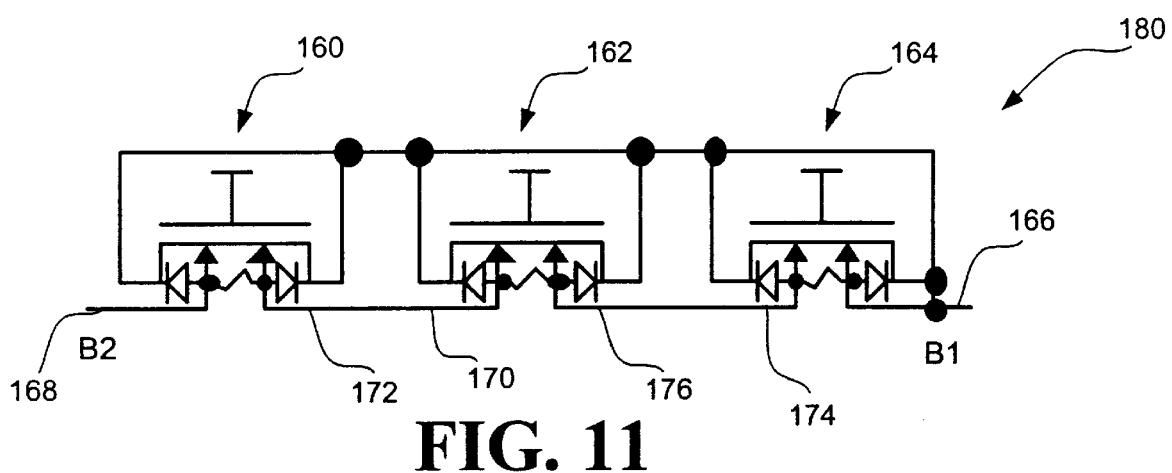
FIG. 11 is a schematic diagram showing another illustrative embodiment for connecting the n-channel resistors of FIGS. 2–4 in a series configuration.

FIG. 11 is a schematic diagram showing another illustrative embodiment for connecting the n-channel resistors of FIGS. 2–4 in a series configuration. In this illustrative embodiment, the three n-channel resistors are shown at 160, 162 and 164, respectively, and collectively form a series resistor 180. The source and drain terminals of each of the resistors 160, 162 and 164 are coupled to the first resistor terminal 166 of the third resistor 164. The first resistor terminal 166 of the third resistor 164 also functions as the output terminal of the series resistor 180. The second resistor terminal 168 of the first resistor 160 functions as the input terminal of the series resistor 180. The second terminal 170 of the second resistor 162 is coupled to the first terminal 172 of the first resistor 160, as shown. Likewise, the second terminal 174 of the third resistor 164 is coupled to the first terminal 176 of the second resistor 162.

Figure 12:
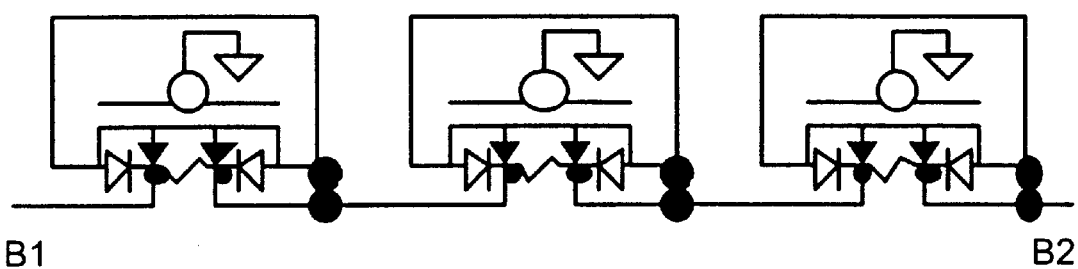
FIG. 12 is a schematic diagram showing an illustrative embodiment for connecting the p-channel resistors of the present invention in a series configuration.
Figure 13:
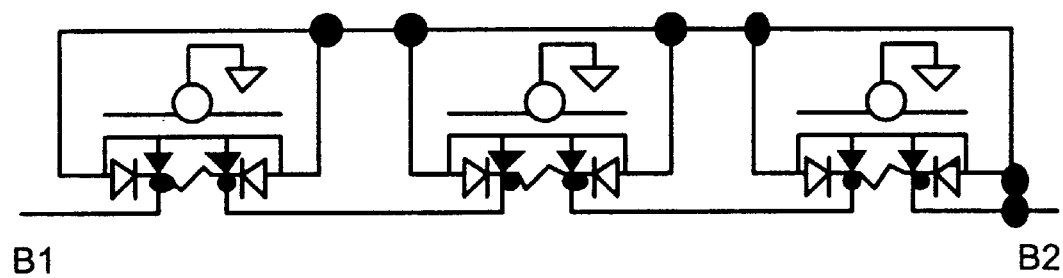
FIG. 13 is a schematic diagram showing another illustrative embodiment for connecting the p-channel resistors of the present invention in a series configuration.

Although FIGS. 10–11 only show n-channel resistors coupled in series, it is contemplated that p-channel type resistors may also be connected in series, as shown in FIGS. 12–13. It is also contemplated that n-channel and p-channel transistor may be joined together in a series configuration.

Figure 14:
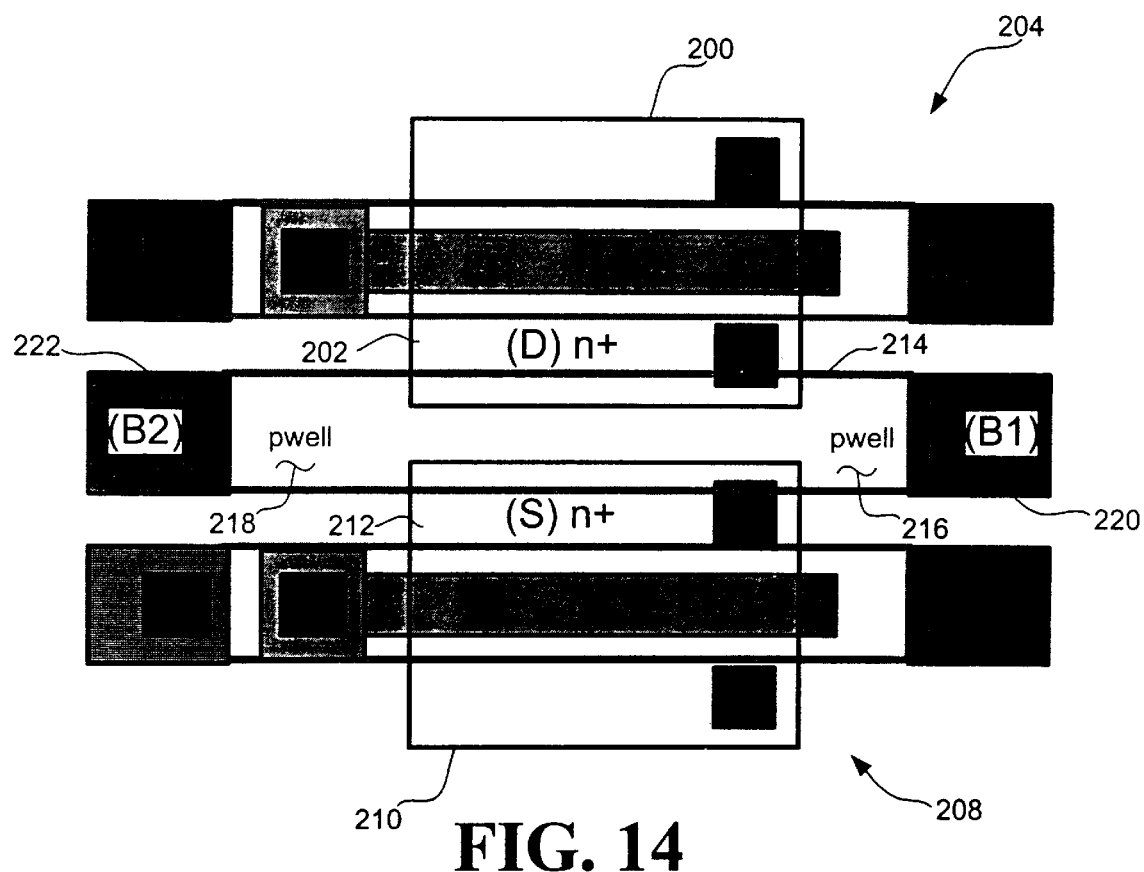
FIG. 14 is a top view of another illustrative resistor of the present invention formed between two adjacent n-channel SOI transistors.

Rather than using the underlayers of only one transistor, it is contemplated that a resistor may be formed between two adjacent transistors. FIG. 14 shows one such embodiment. A first transistor 204 has a first field region 200 that defines the source and/or drain region 202 of the first transistor 204. Likewise, a second transistor 208 has a second field region 210 that defines the source and/or drain region 212 of the second transistor 208. The resistor is formed between the first field region 200 and the second field region 210 by including a body region 214 therebetween. The body region 214 may extend lengthwise from a first end body region 216 on one side of the first/second field regions 200 and 210, to a second end body region 218 on the other side of the first/second field regions 200 and 210. The first end body region 216 may be coupled to the first terminal 220 of the resistor, and the second end body region 218 may be coupled to the second terminal 222 of the resistor.

The body region 214 provides a resistance between the first terminal 220 and the second terminal 222. If desired, this resistance may be modulated by applying a voltage to the first field region 200 and/or second field region 210. The first field region 200 and/or the second field region 210 are preferably coupled to the first terminal 220 of the resistor. However, they may be left floating or coupled to a predetermined voltage such as VDD or VSS. When used in a SOI gate array, this embodiment can provide a resistor without any area penalty, and may behave similar to the resistor shown in FIGS. 2–4 with no gate (G) node.

Figure 15:
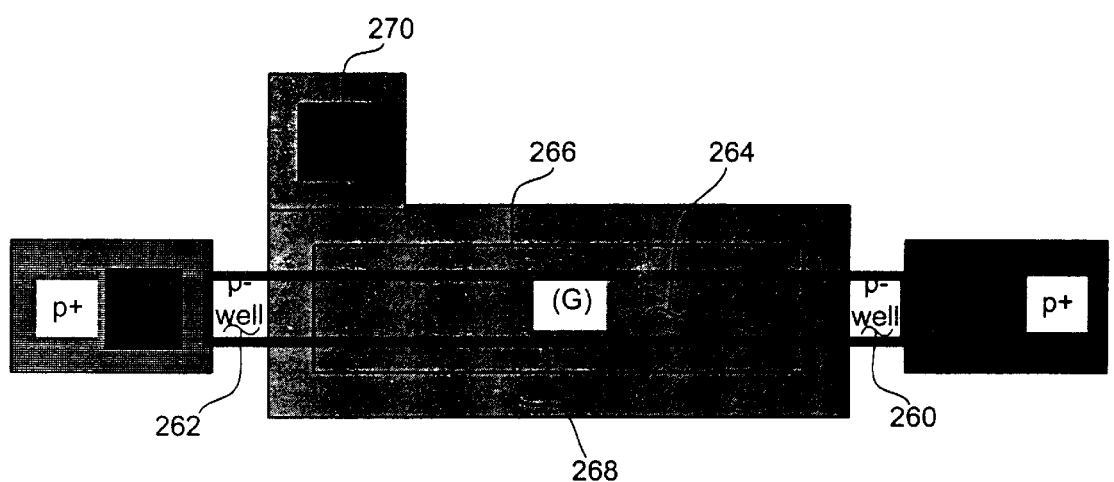
FIG. 15 is a top view of yet another illustrative resistor of the present invention.

In another illustrative embodiment, the resistor may not necessarily be formed from the underlayers of a transistor. Rather, the resistor may be formed from just a field region 266 covered by a gate 268, with no source or drain regions. FIG. 15 is a top view of such a resistor. The resistor includes a body having a first end body region 260, a second end body region 262 and an intermediate body region 264. The intermediate body region 264 extends into the field region 266 under the gate 266. The gate 266 is then coupled to a resistance modulation terminal 270. The resistance of the intermediate body region 264 may be modulated by applying a voltage to the gate 268 via the resistance modulation terminal 270. Although the dual use of a MOSFET transistor and a resistor is lost, a variable resistor is created without requiring any extra processing.

If the SOI technology is fully depleted, rather than only partially depleted, a depletion region extends from the gate oxide to the buried oxide when the gate, source, drain, and first and second terminals are at, for example, an equal voltage. This depletion region causes the resistor to be fully pinched off under certain bias conditions. This can be unacceptable in some applications, such as in some SEU hardening circuits where the resistor must allow some leakage current to flow under steady state conditions.

Figure 16:
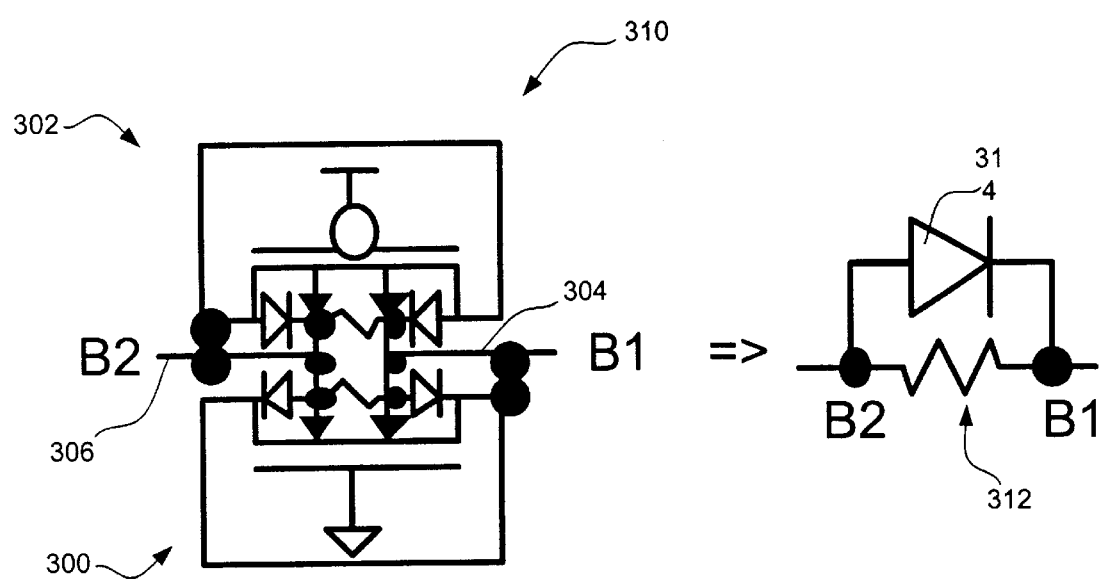
FIG. 16 is a schematic diagram of an illustrative resistor formed from an n-channel SOI transistor and a p-channel SOI transistor, along with an equivalent circuit.

To overcome this limitation, a majority carrier accumulation region may be intentionally created under the gate oxide. This can be accomplished by including both an n-channel transistor 300 and a p-channel transistor 302 in a parallel configuration. One such resistor is shown in FIG. 16. The n-channel transistor 300 has a source, a drain, a body, and a gate, wherein the body extends lengthwise under the gate from a first end body region on one side of the gate to a second end body region on the other side of the gate.

Likewise, the p-channel transistor 302 has a source, a drain, a body, and a gate, wherein the body extends lengthwise under the gate from a first end body region on one side of the gate to a second end body region on the other side of the gate.

The first end body region, the source and the drain of the n-channel transistor 300 and the second end body region of the p-channel transistor 302 are coupled to a first terminal 304 of the resulting resistor 310. Likewise, the first end body region, the source and the drain of the p-channel transistor 302 and the second end body region of the n-channel transistor 300 may be coupled to a second terminal 306 of the resistor 310. Preferably, the gate of the p-channel transistor 302 is coupled to VDD, and the gate of the n-channel transistor 300 is coupled to VSS, as shown.

This configuration provides a majority carrier accumulation region under the gate oxide of either the n-channel transistor 300 or the p-channel transistor 302 under all bias conditions. The n-channel transistor 300 will be in accumulation mode when the gate (G)=L, and S=D=B1=B2=H. Likewise, the p-channel transistor 302 will be in accumulation mode when the gate (G)=H, and S=D=B1=B2=L. Note that this circuit still simplifies down to the single diode 314 in parallel with a resistor 312.

Figure 17:
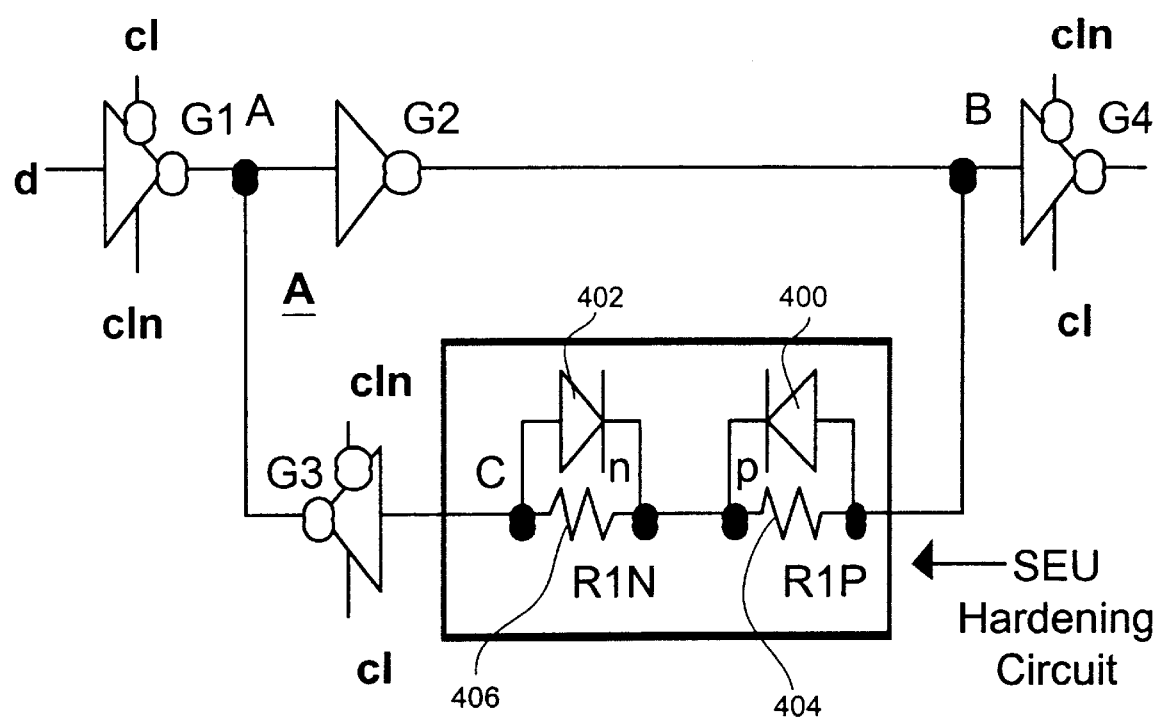
FIG. 17 is a schematic diagram of a data storage circuit incorporating an SEU hardening circuit with back-to-back n-channel and p-channel resistors.

It is recognized that the resistors of the present invention (or other JFET like devices) can be used as a resistive element in an SEU hardening circuit. Compared to the thin film resistor and leaky diode approaches of the prior art, the present resistors have the advantage of not requiring any special processing. Further, the resistors may provide an increased resistance when confronted with a voltage transition, such as during an SEU event, and may provide a decreased resistance when an appropriate gate voltage is applied, such as during a deliberate data state change. FIG. 17 shows one such SEU hardening circuit with an n-channel resistor and a p-channel resistor, where the n-channel gate is connected to VDD and the p-channel gate is connected to VSS to maximize the resistance. Since the parasitic p-diode 400 and the n-diode 402 are back-to-back, no direct leakage path exists in parallel with resistors 404 and 406. It is contemplated that the relative locations of the n-channel resistor and the p-channel resistors are not important. All that is important is that the parasitic diodes are back-to-back to prevent a direct leakage path in parallel with the resistors 404 and 406.

Figure 18:
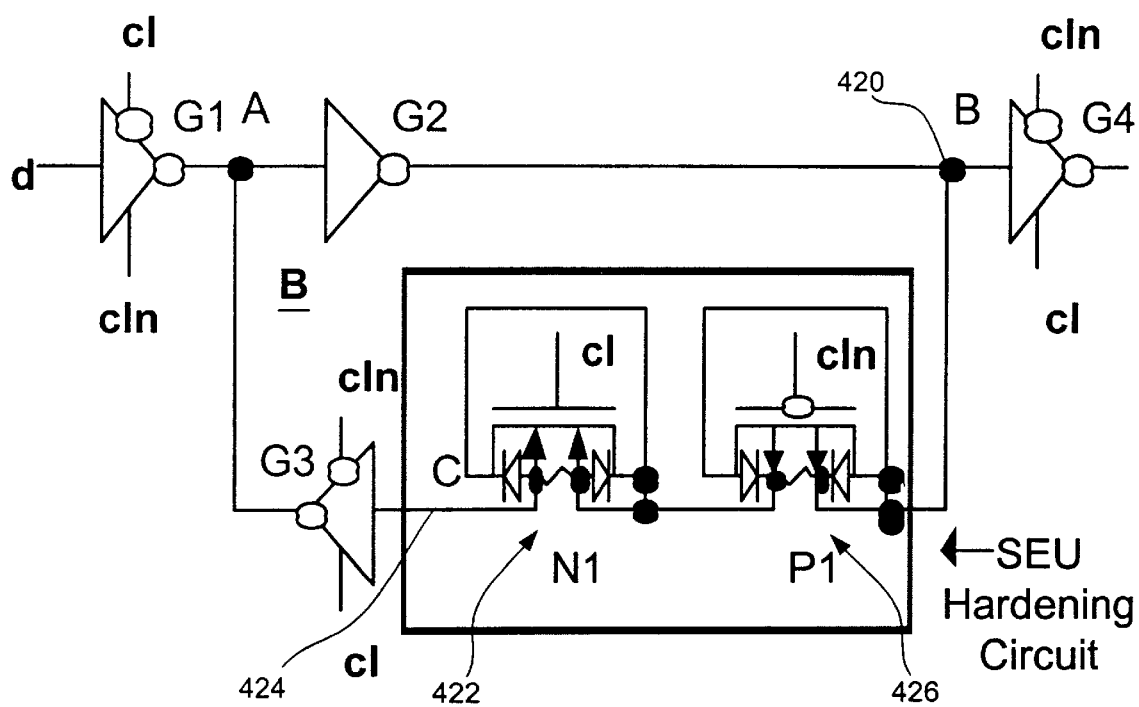
FIG. 18 is a schematic diagram of a data storage circuit similar to that shown in FIG. 17 but with the gates of the n-channel and p-channel resistors coupled to cl/cln, respectively.

FIG. 18 is a schematic diagram of a data storage circuit similar to that shown in FIG. 17 but with the gates of the n-channel and p-channel resistors coupled to cl/cln, respectively. During a data storage condition, cl is set to VDD and cln is set to VSS. This creates a depletion/surface inversion region under the gate oxide, which maximizes the resistance during a voltage transition on node B 420 for maximum SEU hardness. During a deliberate data state change, cl is set to VSS and cln is set to VDD. That reduces the N1 and P1 resistance by creating accumulation regions under the gate oxide, which reduces write time delay. Note that N1 422 has an accumulation region that increases (i.e., resistance decreases) when the voltage on node C 424 and node B 420 increase. In contrast, P1 426 has an accumulation region that increases (i.e., resistance decreases) when the voltage on node C 424 and node B 420 decreases.

Figure 19:
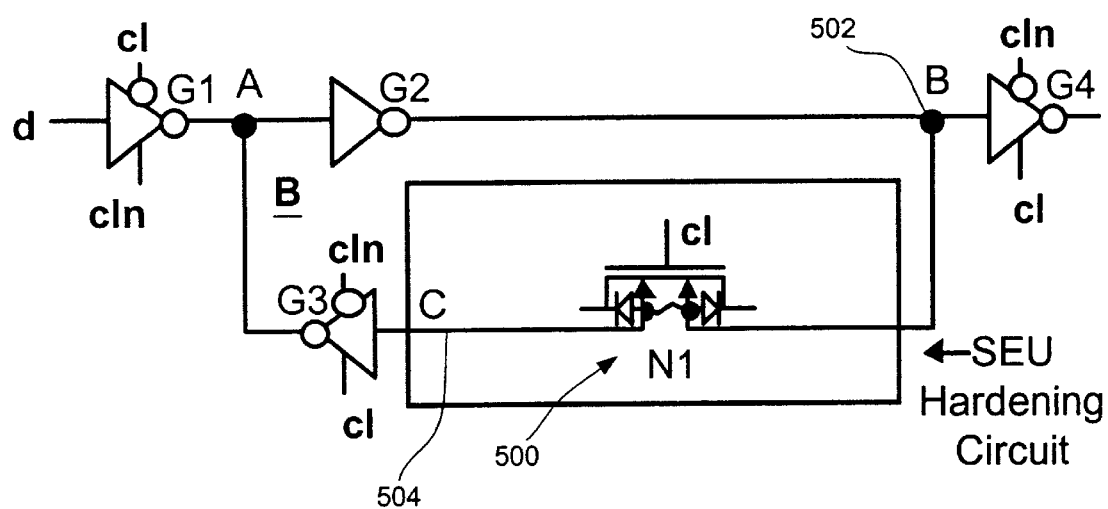
FIG. 19 is a schematic diagram of a data storage circuit incorporating an SEU hardening circuit that has an n-channel resistor with the source and drain nodes floating.

FIG. 19 is a schematic diagram of a data storage circuit incorporating an SEU hardening circuit that has an n-channel resistor with the source and drain nodes floating. In this illustrative embodiment, the source and drain nodes of the n-channel transistor N1 500 are left floating. This eliminates the forward bias parasitic shorting diode path across the resistor. Thus, only one resistor is needed in the feedback path. The gate can be controlled as in FIG. 18 with similar effect. It is recognized that a p-channel resistor could also be used.

Figure 20:
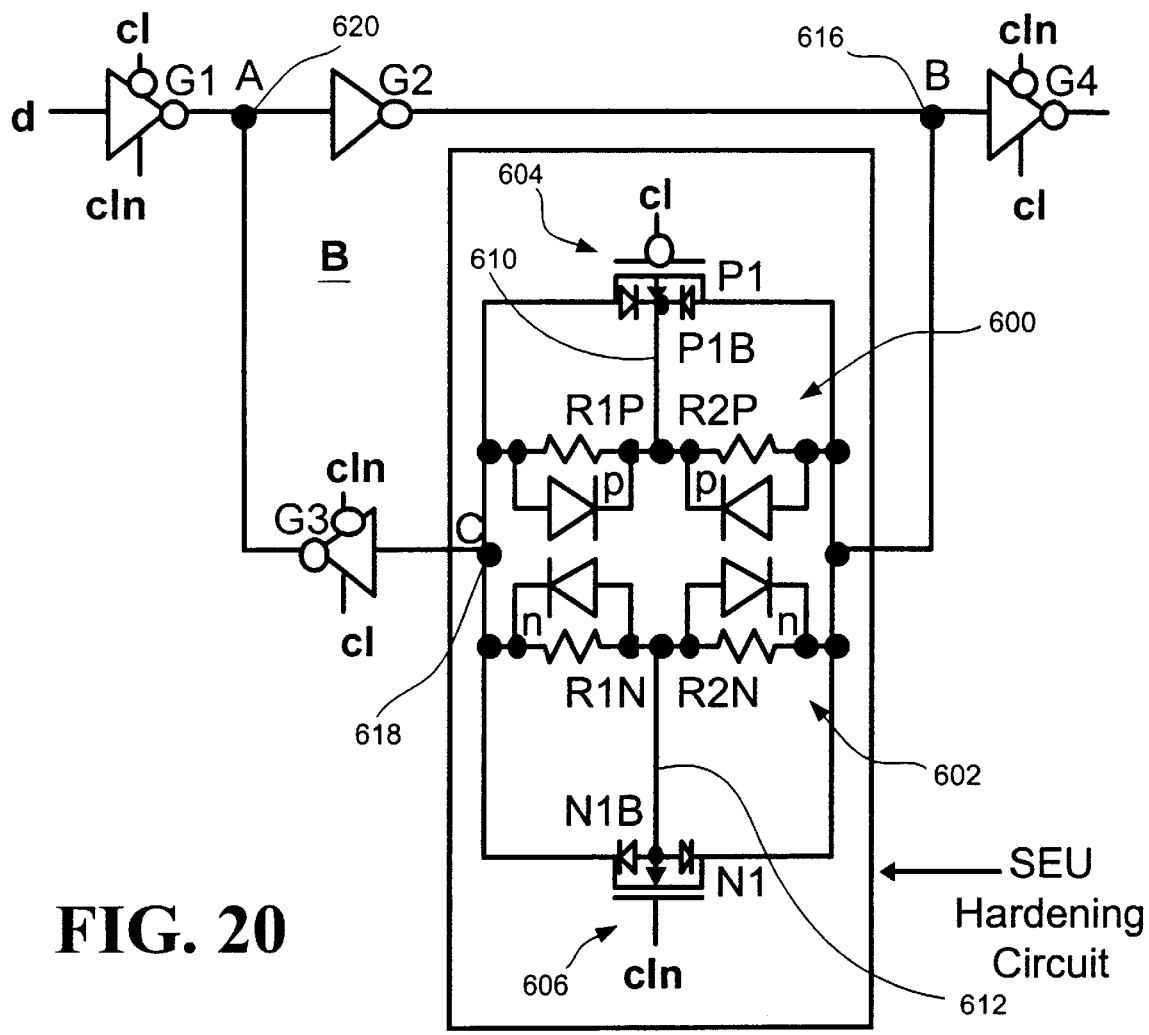
FIG. 20 is a schematic diagram of a data storage circuit incorporating an SEU hardening circuit that uses the resistors of the present invention to form two voltage divider circuits to bias the bodies of the n-channel and p-channel feedback transistors.

FIG. 20 is a schematic diagram of a data storage circuit incorporating an SEU hardening circuit that uses the resistors of the present invention to form two voltage divider circuits to bias the bodies of the n-channel and p-channel feedback transistors. The first and second voltage dividers are shown generally at 600 and 602, respectively. The first voltage divider 600 includes two p-channel type resistors R1P and R2P, with the polarities of the parasitic diodes opposing each other. An intermediate tap voltage 610 is provided to the body of p-channel transistor 604 as shown. The second voltage divider 602 includes two n-channel type resistors R1N and R2N, with the polarities of the parasitic diodes opposing each other. An intermediate tap voltage 612 is provided to the body of n-channel transistor 606 as shown.

When P1 604 and N1 606 are on, full rail drive (i.e., node B drives node C to VDD or VSS) is provided. If P1 604 and N1 606 are off, and node B 616 and node C 618 are high, the voltage dividers 600 and 602 ensure that the p-channel substrate P1B and the n-channel substrate N1B are also high. There are no reverse biased junctions and no voltage gradients in the silicon associated with P1 604 and N1 606. The same holds true if node B 618 and node C 616 are low. Therefore, there are no sensitive volumes associated with p-channel transistor P1 604 and n-channel transistor N1 606. It is contemplated that the n-channel and p-channel designations on the resistor in the voltage dividers 600 and 602 may be changed without significantly affecting the operation of the circuit. A further discussion of the general operation of this circuit can be found in co-pending U.S. patent application Ser. No. 09/219,807, filed Dec. 23, 1998, and entitled "SEU Hardening Circuit", which is incorporated herein by reference.

Figure 21:
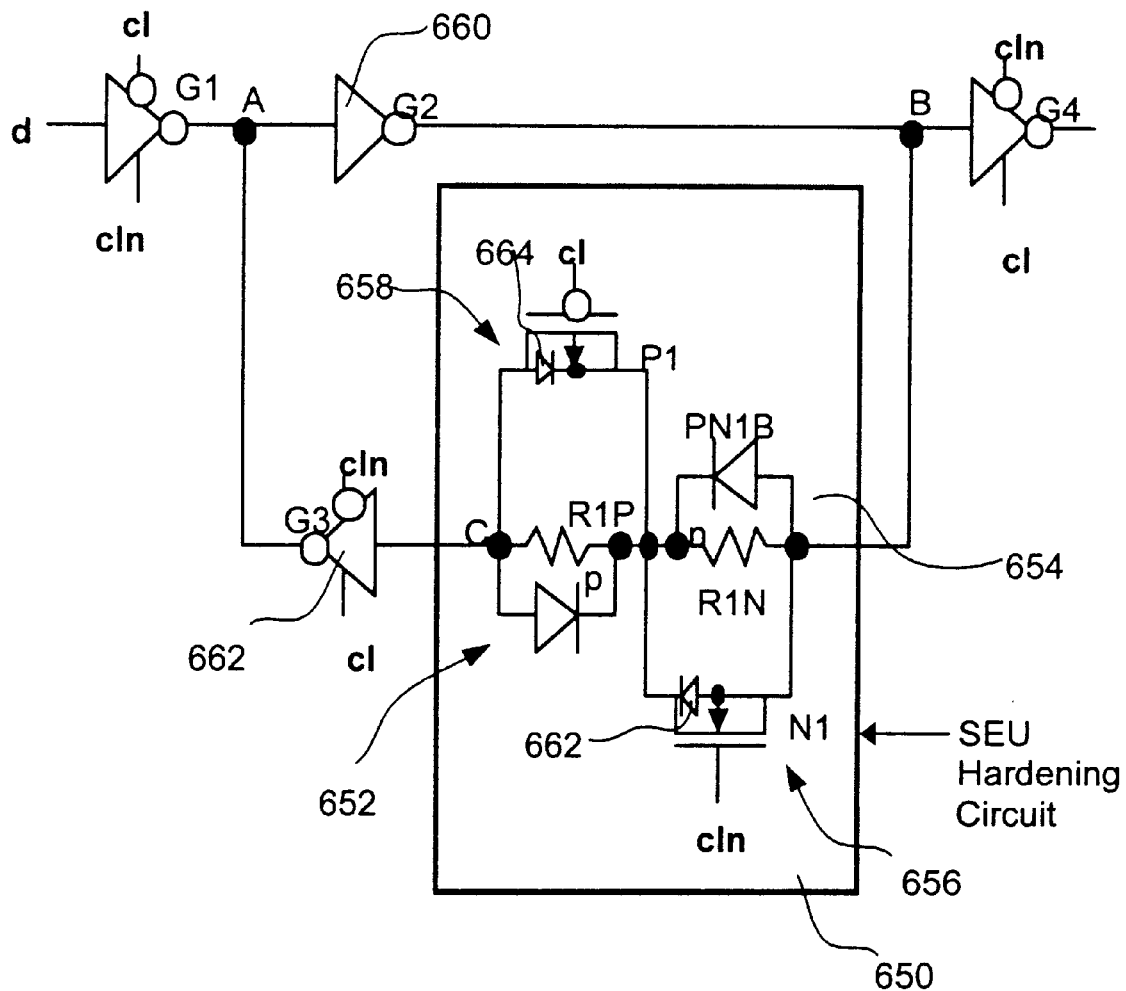
FIG. 21 is a schematic diagram of a data storage circuit incorporating an SEU hardening circuit that uses the resistors of the present invention to form a voltage divider circuit to bias the n-channel and p-channel feedback transistors.

FIG. 21 is a schematic diagram of a data storage circuit incorporating an SEU hardening circuit that uses the resistors of the present invention to form a voltage divider circuit to bias the n-channel and p-channel feedback transistors. The SEU hardening circuit is generally shown at 650. In the embodiment shown, a first resistors 652 and a second resistor 654 are placed in series, with an n-channel transistor N1 656 connected in parallel with resistor 654 and a p-channel transistor P1 658 connected in parallel with resistor 652. The first resistor 652 and the second resistor 654 are n-channel or p-channel resistors, with the polarities of the parasitic diodes opposing each other as shown.

It is contemplated that the n-channel and p-channel designations on the resistor in FIGS. 17–21 may be changed without significantly affecting the operation of the circuit, so long as the parasitic diodes are placed in a back-to-back configuration. Further, it is contemplated that two n-channel may be used together or two p-channel transistors may be used together. Thus, if two resistors are used, four combinations of resistor pairings exists.

The source of the n-channel transistor N1 656 is connected to an output of Inverter G2 660, and the source of the p-channel transistor P1 658 is connected to the input of Inverter G3 662. The drain of the n-channel transistor N1 656 is connected to the drain of the p-channel transistor P1 658, as shown. To prevent bipolar action in the n-channel transistor N1 656, the body and source of the n-channel transistor N1 656 are tied together as shown. To prevent bipolar action in the p-channel transistor P1 658, the body and drain of a p-channel transistor P1 658 are tied together, as shown.

In this configuration, the n-channel transistor N1 656 has a parasitic diode 662 between its body and drain. Likewise, the p-channel transistor P1 658 has a parasitic diode 664 between its source and body. However, because the parasitic diodes 662 and 664 are not aligned with one another, current cannot directly flow through the n-channel transistor N1 656 and the p-channel transistor P1 658 via the parasitic diodes 662 and 664. Rather, the current must flow through at least one of the resistor elements 652 and 654. A further discussion of the general operation of this and other related circuits can be found in co-pending U.S. patent application Ser. No. 09/219,807, filed Dec. 23, 1998, and entitled "SEU Hardening Circuit", which is incorporated herein by reference.

Having thus described the preferred embodiments of the present invention, those of skill in the art will readily appreciate that the teachings found herein may be applied to yet other embodiments within the scope of the claims hereto attached.

What is claimed is:

1. An impedance device having a first terminal and a second terminal, comprising:
    an SOI transistor device having a source, a drain, a body, and a gate; the source and the drain each having an upper end, a lower end and a facing edge, wherein the upper end and the lower end define the length of the corresponding facing edge, the facing edge of the source facing the facing edge of the drain with the body extending therebetween, the body extending lengthwise under the gate from a first end body region adjacent the upper end of the source and/or drain to a second end body region adjacent the lower end of the source and/or drain;
    the first end body region coupled to the first terminal of the impedance device; and
    the second end body region coupled to the second terminal of the impedance device.

2. An impedance device according to claim 1, wherein the source region is coupled to the first terminal of the impedance device.

3. An impedance device according to claim 2, wherein the drain region is coupled to the first terminal of the impedance device.

4. An impedance device according to claim 3, wherein the gate of the SOI transistor is coupled to a predetermined voltage.

5. An impedance device according to claim 4, wherein the predetermined voltage is VDD.

6. An impedance device according to claim 4, wherein the predetermined voltage is VSS.

7. An impedance device according to claim 3, wherein the gate of the SOI transistor is coupled to the first terminal of the impedance device.

8. An impedance device according to claim 3, wherein the gate of the SOI transistor is coupled to the second terminal of the impedance device.

9. An impedance device according to claim 8, wherein the gate terminal is coupled to the first terminal or second terminal of the impedance device.

10. An impedance device according to claim 9, wherein the source region and the drain region are coupled to the first terminal or second terminal of the impedance device.

11. An impedance device according to claim 1, wherein the SOI transistor is a p-channel device.

12. An impedance device according to claim 1, wherein the SOI transistor is a n-channel device.

13. An impedance device according to claim 12, wherein the first transistor and the second transistor are n-channel devices.

14. An impedance device having a first terminal and a second terminal, comprising:
    a first field cut region forming a source or drain of a first transistor;
    a second field cut region forming a source or drain of a second transistor, wherein the first field cut region is spaced from the second field cut region;
    the source or drain of the first transistor and the source or drain of the second transistor each having an upper end, a lower end and a facing edge, wherein the upper end and the lower end define the length of the corresponding facing edge, the facing edge of the source or drain of the first transistor facing the facing edge of the source or drain of the second transistor;
    a body disposed in the space between the first field cut region and the second field cut region,
    wherein the body extends lengthwise from a first end body region adjacent the upper end of the source and/or drain of the first and second transistors to a second end body region adjacent the lower end of the source and/or drain of the first and second transistors;
    the first end body region coupled to the first terminal of the impedance device; and
    the second end body region coupled to the second terminal of the impedance device.

15. An impedance device according to claim 14, wherein the first field region is coupled to the first terminal of the impedance device.

16. An impedance device according to claim 14, wherein the second field region is coupled to the first terminal of the impedance device.

17. An impedance device according to claim 14, wherein the first transistor and the second transistor are p-channel devices.

18. An impedance device having an first terminal, an second terminal, and a resistance modulation terminal, comprising:
    a source region;
    a drain region spaced from the source region;
    a body region;
    the source region and the drain regions each having an upper end, a lower end and a facing edge, wherein the upper end and the lower end define the length of the corresponding facing edge, the facing edge of the source facing the facing edge of the drain with the body region extending therebetween, the body region extending lengthwise between the source region and the drain region from a first end body region adjacent the upper end of the source and/or drain regions to a second end body region adjacent the lower end of the source and/or drain regions;
    the first end body region coupled to the first terminal of the impedance device;
    the second end body region coupled to the second terminal of the impedance device;
    at least one of the source region and the drain region connected to the resistance modulation terminal, wherein a voltage applied to the resistance modulation terminal causes a depletion region in the body region to change, thereby changing the resistance between the input terminal and the output terminal of the impedance device.

19. An impedance device according to claim 18, wherein both the source region and drain region are connected to the resistance modulation terminal of the impedance device.

20. An impedance device according to claim 18, further comprising a gate positioned above the body region, wherein the gate is coupled to a gate terminal; a voltage applied to the gate terminal further changing the depletion region in the body, thereby further changing the resistance between the first terminal and the second terminal of the impedance device.

21. An impedance device according to claim 20, wherein the gate terminal is coupled to VDD or VSS.

22. An impedance device having a first terminal and a second terminal, comprising:

a n-channel SOI transistor device having a source, a drain, a body, and a gate;

the source region and the drain of the n-channel SOI transistor device each having an upper end, a lower end and a facing edge, wherein the upper end and the lower end define the length of the corresponding facing edge, the facing edge of the source facing the facing edge of the drain with the body region extending therebetween, the body of the n-channel SOI transistor device extending lengthwise between the source and the drain from a first end body region adjacent the first upper end of the source and/or drain to a second end body region adjacent the lower end of the source and/or drain;

a p-channel SOI transistor device having a source, a drain, a body, and a gate; the source region and the drain of the p-channel SOI transistor device each having an upper end, a lower end and a facing edge, wherein the upper end and the lower end define the length of the corresponding facing edge, the facing edge of the source facing the facing edge of the drain with the body region extending therebetween, the body of the p-channel SOI transistor device extending lengthwise between the source and the drain from a first end body region adjacent the upper end of the source and/or drain to a second end body region adjacent the lower end of the source and/or drain;

the body, the source and the drain of the n-channel transistor and the second end body region of the p-channel transistor being coupled to the first terminal of the impedance device; the first end body region, the source and the drain of the p-channel transistor and the second end body region of the n-channel transistor being coupled to the second terminal of the impedance device; the gate of the p-channel transistor coupled to a first voltage and the gate of the n-channel transistor coupled to a second voltage.

23. An impedance device according to claim 22, wherein the first voltage is VDD and the second voltage is VSS.

24. A SEU hardening circuit for use with a storage cell, wherein the storage cell includes a pair of cross-coupled inverters, the SEU hardening circuit having a input terminal and a output terminal, the input terminal connected to an output of one of the cross-coupled inverters, and the output terminal connected to an input of the other one of the cross-coupled inverters, the SEU hardening circuit comprising:

an SOI transistor device having a source, a drain, a body, and a gate; the source and the drain having a width, wherein the body extends lengthwise under the gate from a first end body region on one side of the source and/or drain to a second end body region on the other side of the source and/or drain;

the first end body region coupled to the input terminal of the SEU hardening circuit;

the second end body region coupled to the output terminal of the SEU hardening circuit.

25. An impedance device according to claim 21, wherein the source region and the drain region are coupled to the first terminal or the second terminal of the impedance device.

* * * * *